United States Patent [19]

Yoshihisa et al.

[11] Patent Number: 4,464,632

[45] Date of Patent: Aug. 7, 1984

[54] VOLUME CONTROL CIRCUIT

[75] Inventors: Kozo Yoshihisa; Isamu Okui, both of Fukaya, Japan

[73] Assignee: Tokyo Shibaura Denki Kabushiki Kaisha, Kanagawa, Japan

[21] Appl. No.: 275,155

[22] Filed: Jun. 19, 1981

[30] Foreign Application Priority Data

Jul. 8, 1980 [JP] Japan .................................. 55/93047

[51] Int. Cl.³ ........................... H03F 3/45; H03G 3/30
[52] U.S. Cl. ..................................... 330/254; 330/257
[58] Field of Search .................. 330/254, 257; 358/27; 179/1 VL

[56] References Cited

U.S. PATENT DOCUMENTS 3,684,974 8/1972 Solomon et al. ..................... 330/254
4,065,725 12/1977 Lillis et al. .......................... 330/254
4,219,781 8/1980 Naokawa ............................ 330/254
4,331,929 5/1982 Yokoyama .......................... 330/254

FOREIGN PATENT DOCUMENTS 55-47714 4/1980 Japan .................................. 330/254

OTHER PUBLICATIONS

Kubo, "Electrical Volume Control for Differential Amplifier", *Denshi Tenbou*, Nov. 1972, p. 74, Article No. 43.

*Primary Examiner*—James B. Mullins
*Attorney, Agent, or Firm*—Banner, Birch, McKie & Beckett

[57] ABSTRACT

A volume control circuit is provided which is not influenced by power supply fluctuations and which eliminates the audio signal component when the circuit is adjusted to minimum volume. An audio input signal is amplified by a differential amplifier and supplied to a substantially doubly balanced differential amplifier. Gain control of the audio signal is achieved by adjusting the bias voltage of the doubly balanced differential amplifier. The collector electrodes of two transistors used during minimum volume operation are connected directly to a power supply line. The controlled audio signal is supplied from the doubly balanced differential amplifier to a current mirror circuit which functions to cancel fluctuations in the power source. The connection of the collector electrodes of the two transistors in the doubly balanced differential amplifier to the power supply line functions to eliminate an audio component on the output when the volume control is set to minimum volume.

1 Claim, 2 Drawing Figures

VOLUME CONTROL CIRCUIT

BACKGROUND OF THE INVENTION

This invention relates to a control circuit and more particularly to a volume control circuit.

A conventional volume control circuit, which may be an integrated semiconductor circuit, is generally shown in FIG. 1. This volume control circuit is used in an audio circuit stage of a television receiver. Referring now to FIG. 1, an audio signal at input terminal 10 is applied to differential amplifier 11 via coupling condenser C11. The differential amplifier 11 comprises first and second transistors Q11 and Q12. The base electrode of the first transistor Q11 is connected to the condenser C11 and positive terminal of a fixed DC voltage source V11 through resistor R13. The negative terminal of voltage source V11 is connected to ground line L10. The emitter electrode of the first transistor Q11 is connected to the ground line L10 through a resistor R11. The base electrode of the second transistor Q12 is also connected to the positive terminal of the voltage source V11 through a resistor R14. The emitter electrode of the second transistor Q12 is connected to the ground line L10 through a resistor R12. The audio signal, after being amplified by the differential amplifier 11, is supplied from the collector electrode of each of the first and second transistors Q11 and Q12 to a doubly balanced differential amplifier 12 which controls the gain of the audio signal. The doubly balanced differential amplifier 12 comprises third to sixth transistors Q13 to Q16. The emitter electrodes of the third and fourth transistors Q13 and Q14 are connected in common to the collector electrode of the first transistor Q11. The emitter electrodes of the fifth and sixth transistors Q15 and Q16 are connected in common to the collector electrode of the second transistor Q12.

The base electrodes of the third and sixth transistors Q13 and Q16 are connected in common to a positive terminal of a variable DC voltage source V12. The negative terminal of voltage source V12 is connected to the ground line L10. The base electrodes of the fourth and fifth transistors Q14 and Q15 are connected in common to a positive terminal of a fixed DC voltage source V13. The negative terminal of voltage source V13 is connected to the ground line L10. The collector electrodes of the third and fifth transistors Q13 and Q15 are connected in common to a line L11 of a power supply source (not shown) through a resistor R15. The collector electrodes of the fourth and sixth transistors Q14 and Q16 are connected in common to the line L11 of the power supply source. The doubly balanced amplifier 12 delivers a controlled audio signal from the common collectors of the third and fifth transistors Q13 and Q15 to the base electrode of an emitter follower transistor Q17. The collector electrode of the transistor Q17 is connected to the line L11 of the power supply source. The emitter electrode of the transistor Q17 is connected to the ground line L10 through a constant current source 13 and is also connected to an output terminal 14. The controlled audio signal is supplied from the output terminal 14 to a loudspeaker (not shown).

When an audio signal is applied to the differential amplifier 11 via the condenser C11, a constant current having a value Io flows through the collector and emitter path of the second transistor Q12 in accordance with a value E11 of the voltage source V11. On the other hand, an audio signal current having a value $Io+i_s$, where $i_s$ is an audio signal component superimposed on the constant current, flows through the collector and emitter path of the first transistor Q11 in accordance with the value E11 of the voltage source V11 and level of the audio input signal. Both the constant and audio signal currents are supplied to the doubly balanced differential amplifier 12 to control the gain of the audio signal. The gain control function of the doubly balanced differential amplifier 12 is achieved by adjusting a value E12 of the voltage source V12 in relation to a value E13 of the voltage source V13. When the value E12 is larger than the value E13 and the value E12 is increased until the third and sixth transistors Q13 and Q16 conduct and the fourth and fifth transistors Q14 and Q15 are cut off, the gain of the audio signal, that is, the volume is maximized. On the contrary, when the value E12 is smaller than the value E13, and the value E12 is decreased until the third and sixth transistors Q13 and Q16 are cut off and the fourth and fifth transistors Q14 and Q15 conduct, the gain of the audio signal is minimized.

In case the power supply line L11 of the power supply source includes a ripple component, a ripple component is superimposed on the controlled audio signal at the collector electrodes of the third and fifth transistors Q13 and Q15. In other words, an undesirable audio noise component is added to the controlled audio signal. Also, since the above described volume control circuit is formed on an integrated circuit, the ground line L10 is grounded via a common lead line 15. This common lead line 15 is connected to the common emitter resistors R11 and R12 of the first and second transistors Q11 and Q12. Since the lead line 15 has a very small resistance, a very small voltage corresponding at the level of the audio input signal to the input terminal 10 occurrs across the lead line 15. The voltage across the lead line 15 varies in accordance with the level of the audio input signal. Accordingly, the potential of the ground line L10 continuously fluctuates and causes current fluctuation in the constant current flowing through the collector and emitter path of the second transistor Q12. As a result, even if the volume control is adjusted to the minimum, the output signal delivered from the output terminal 14 includes an audio signal component. Further, if the voltage source V11 has an internal resistor, the second transistor Q12 is biased by the voltage across the internal resistor which corresponds to the level of the audio input signal, in addition to the value E11 of the voltage source V11. As a result, an audio component occurs even if the volume control is adjusted to the minimum.

SUMMARY OF THE INVENTION

It is accordingly an object of this invention to provide a volume control circuit which is not influenced by the fluctuation of a power supply source.

It is an additional object of this invention to provide a volume control circuit which eliminates the audio signal component when the volume control is adjusted to the minimum.

It is a further object of this invention to provide a volume control circuit which can be formed as a semiconductor integrated circuit.

According to the present invention, a volume control circuit includes a pair of reference potential lines, an input terminal and an output terminal. The input terminal is connected to a differential amplifier comprising first and second transistors. The differential amplifier is constituted so that the emitter electrode of each of the transistors is coupled to one of the reference potential lines and the base electrode of the first transistor is coupled to the input terminal. The audio input signal, after being amplified by the differential amplifier, is supplied from the collector electrode of each of the transistors to a substantially doubly balanced differential amplifier, which comprises third to sixth transistors. The emitter electrodes of the third and fourth transistors of the doubly balanced differential amplifier are connected in common to the collector electrode of the first transistor. The emitter electrodes of the fifth and sixth transistors are connected in common to the collector electrode of the second transistor. The collector electrodes of the fourth and fifth transistors are connected in common to the other reference potential line. In order to control the volume, a variable reference voltage is applied to the common base electrodes of the third and sixth transistors and a fixed reference voltage is applied to the base electrodes of the fourth and fifth transistors. A controlled audio signal is delivered from the collector electrode of each of the third and sixth transistors to a current mirror circuit, which comprises seventh and eighth transistors. The emitter electrode of the seventh transistor of the current mirror circuit is connected to the collector electrode of the third transistor and the emitter electrode of the eighth transistor is connected to the collector electrode of the sixth transistor; both emitter electrodes also are coupled to the other reference potential line. The base electrodes of the seventh and eighth transistors are connected to each other. The collector electrode of the eighth transistor is connected in common to its base electrode; and the collector electrode of the seventh transistor is coupled to the output terminal. The controlled audio signal from the output terminal is provided to a loudspeaker.

In the above described volume control circuit, the controlled audio signal is supplied through the current mirror circuit. Therefore, it is not influenced by the fluctuation in the other reference potential line. Furthermore, since the controlled audio signal from the common collector electrodes of the fourth and fifth transistors is bypassed to the other reference line, an audio component is not generated when the volume control is adjusted to the minimum.

The objects and advantages of the present invention will become apparent to persons skilled in the art from a study of the following description of the accompanying drawings.

DESCRIPTION OF THE PREFERRED EMBODIMENT

Figure 1:
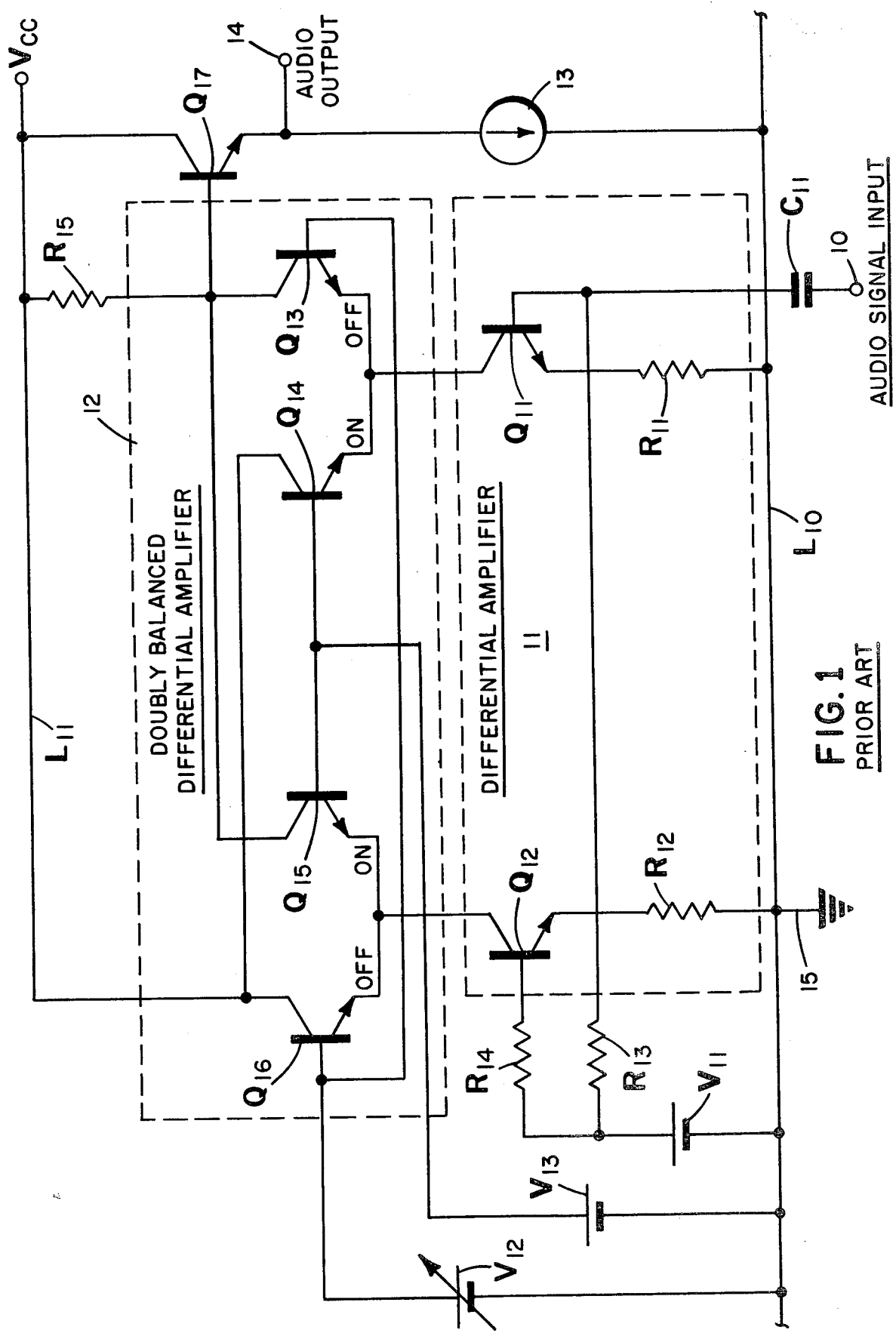
FIG. 1 is a circuit diagram of a conventional volume control circuit.
Figure 2:
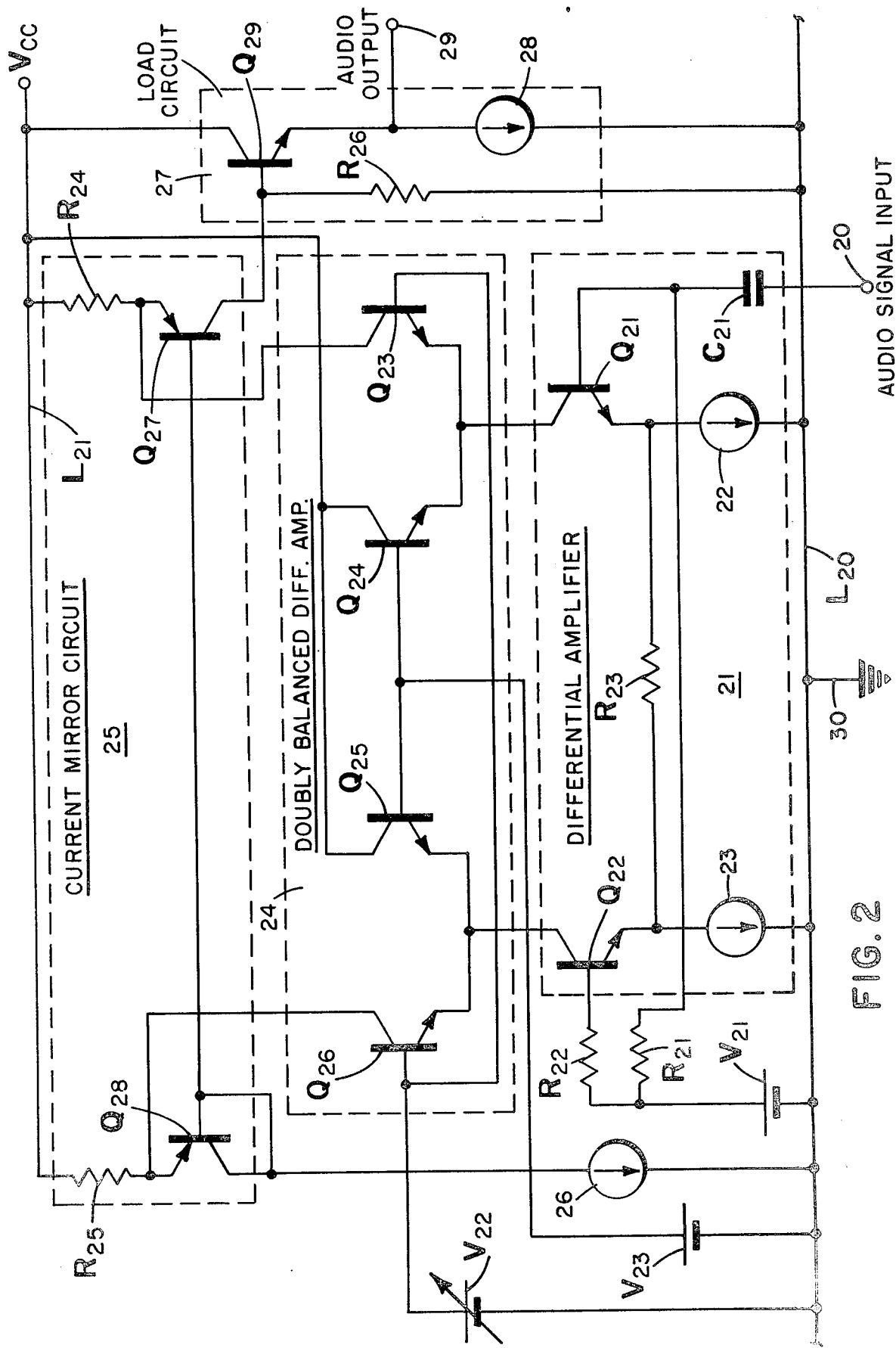
FIG. 2 is a circuit diagram of a volume control circuit according to the present invention.

Referring now to FIG. 2, an audio signal at input terminal 20 is applied to differential amplifier 21 via coupling condenser C21. The differential amplifier 21 comprises first and second transistors Q21 and Q22. The base electrode of the first transistor Q21 is connected to the condenser C21 and to a positive terminal of a fixed DC voltage source V21 through resistor R21. The negative terminal of a source V21 is connected to ground line L20. The emitter electrode of the first transistor Q21 is connected to the ground line L20 through a constant current source 22. The base electrode of the second transistor Q22 is also connected to the positive terminal of the voltage source V21 through a resistor R22. The emitter electrode of the second transistor Q22 is connected to the ground line L20 through a constant current source 23 and to the emitter electrode of the first transistor Q21 through a resistor R23.

The audio signal, after being amplified by the differential amplifier 21, is supplied from the collector electrode of each of the first and second transistors Q21 and Q22 to a substantially doubly balanced amplifier 24 which controls the gain of the audio signal. The doubly balanced differential amplifier 24 comprises third to sixth transistors Q23 to Q26. The emitter electrodes of the third and fourth transistor Q23 and Q24 are connected in common to the collector electrode of the first transistor Q21. The emitter electrodes of the fifth and sixth transistors Q25 and Q26 are connected in common to the collector electrode of the second transistor Q22. The base electrodes of the third and sixth transistors Q23 and Q26 are connected in common to a positive terminal of a variable DC voltage source V22, the negative terminal of which is connected to the ground line L20. The base electrodes of the fourth and fifth transistors Q24 and Q25 are connected in common to a positive terminal of a fixed DC voltage source V23, the negative terminal of which is connected to the ground line L20.

A controlled audio signal is supplied from the collector electrode of each of the third and sixth transistors Q23 and Q26 to a current mirror circuit 25. The collector electrodes of the fourth and fifth transistors are connected in common to line L21 of a power supply source Vcc. Accordingly, the controlled audio signal is bypassed to the line L21. The current mirror circuit 25 comprises seventh and eighth transistors Q27 and Q28. The emitter electrode of the seventh transistor Q27 is connected to the collector electrode of the third transistor Q23 and to the line L21 of the power source supply through a resistor R24. The emitter electrode of the eighth transistor Q28 is connected to the collector electrode of the sixth transistor Q26 and to the line L21 of the power source supply through a resistor R25. The base electrode of the eighth transistor Q28 is connected to the base electrode of the seventh transistor Q27. The collector electrode of the eighth transistor Q28 is connected to its base electrode and to the ground line L20 through a constant current source 26.

The controlled audio signal is supplied from the collector electrode of the seventh transistor Q27 to the base electrode of an emitter follower transistor Q29 in load circuit 27. The base electrode of the transistor Q29 is connected to the ground line L20 through a resistor R26. The emitter electrode of the transistor Q29 is connected to the ground line L20 through a constant current source 28 and to an output terminal 29. The controlled audio signal is provided from the output terminal 29 to a loudspeaker.

The operation of the above described volume control circuit is as follows. When an audio signal having a value Vs is applied to the differential applifier 21 via the input terminal 20 and the condenser C21, the value of the audio signal current flowing through resistor R23 is expressed as follows:

$$i_s = V_s/R_a; \qquad (1)$$

where Ra is the resistance of resistor R23.

Accordingly, if the current of the constant current source 22 is equal to that of the constant current source 23 and is expressed as $I_{01}$, a value of the audio signal current at the collector electrode of the first transistor Q21 is $(I_{01}+i_s)$ and the value of the audio signal current at the collector electrode of the second transistor Q22 is $(I_{01}-i_s)$.

The audio signal current from each of the first and second transistors Q21 and Q22 is supplied to the doubly balanced amplifier 24 to control the gain of the audio signal. The control function of the doubly balanced differential amplifier 24 is achieved by adjusting the value E22 of the voltage source V22 in relation to the value E23 of the voltage source V23. When the value E22 is larger than the value E23, and the value E22 is increased until the third and sixth transistors Q23 and Q26 conduct and the fourth and fifth transistors Q24 and Q25 are cut off, the audio signal current from the collector electrode of each of the first and second transistors Q21 and Q22 flows only through the collector and emitter path of each of the third and sixth transistors Q23 and Q26, respectively. Accordingly, the gain of the audio signal, that is, the volume, is maximized. On the contrary, when the value E22 is smaller than the value E23, and the value E22 is decreased until the third and sixth transistors Q23 and Q26 are cut off and the fourth and fifth transistors Q24 and Q25 conduct, the audio signal current from the collector electrode of each of the first and second transistors Q21 and Q22 flows only though the collector and emitter paths of each of the fourth and fifth transistors Q24 and Q25, respectively. Accordingly, the gain of the audio signal is minimized.

The maximum gain of the audio signal in the volume control circuit is calculated below. Since the seventh and eight transistors Q27 and Q28 constitute the current mirror circuit 25, the value of the controlled audio signal current flowing through the resistor R24 is equal to that of the controlled audio signal current flowing though the resistor R25, where the resistance of the resistor R24 is equal to that of the resistor R25. That is, $$I_{02}+I_{01}-i_s=I_c+I_{01}+i_s \quad (2)$$

where $I_{02}$ is the current of the constant current source 26 and $I_c$ is the controlled audio signal supplied from the collector electrode of the seventh transistor Q27.

From the expression (2), $I_c$ can be calculated as follows:

$$I_c=I_{02}-2i_c \quad (3)$$

Accordingly, the output voltage Vo of the controlled audio signal at output terminal 29 is expressed as follows:

$$V_o=(I_{02}-2i_s)(R_b), \quad (4)$$

where $R_b$ is the resistance of the resistor R26.

The AC component of the output voltage Vo is as follows:

$$V_o=(2i_s)(R_b) \quad (5)$$

As a result, the maximum gain $G_{max}$ of the audio signal is expressed as follows:

$$G_{max} = \frac{V_o}{V_s} \quad (6)$$

$$= \frac{2R_b}{R_a}$$

In the above circuit, the volume control is not influenced by fluctuations in the power source. Even if the power source in line L21 includes a fluctuation component such as a ripple, the bias voltage across the base and emitter electrodes of each of the seventh and eighth transistors Q27 and Q28 is unvaried because the seventh and eight transistors Q27 and Q28 constitutes the current mirror circuit 25. Accordingly, the ripple component in line L21 is cancelled by the seventh and eighth transistors Q27 and Q28. The controlled audio signal from the collector electrode of the seventh transistor Q27 does not include the fluctuation element or ripple of the power source. The volume control circuit also does not generate an audio component when the volume control is adjusted to the minimum. Since both the collector electrodes of the fourth and fifth transistors Q24 and Q25 are connected to the line L21, the controlled audio signal current flowing through the collector and emitter path of each of the fourth and fifth transistors Q24 and Q25 is constantly bypassed to the line L21. Accordingly, when the volume is minimum, the controlled audio signal is not provided from the output terminal 29.

Furthermore, even if the volume control circuit is integrated into a semiconductor, and the ground line L20 is grounded through a common lead line 30 outside the semiconductor, the current flowing from the constant current sources 22 and 23 into the lead line 30 is unvaried and is independent of the audio input signal. Accordingly, the potential in the ground line L20 does not fluctuate. As a result, the volume control circuit does not generate an audio component when the volume is minimum.

It will be apparent to those skilled in the art that various modifications and variations could be made in the volume control circuit of the invention without departing from the scope or spirit of the invention.

We claim:

1. A volume control circuit having a pair of reference potential lines, an input terminal and an output terminal, said volume control circuit comprising:

a differential amplifier comprising first and second transistors, the emitter electrode of said first transistor being connected to the emitter electrode of said second transistor through a resistor and to one of said reference potential lines through a first constant current source, the emitter electrode of said second transistor being connected to said one reference potential line through a second constant current source;

a substantially doubly balanced differential amplifier comprising third, fourth, fifth and sixth transistors, the emitter electrodes of said third and fourth transistors being connected in common to the collector electrode of said first transistor, the emitter electrodes of said fifth and sixth transistors being connected in common to the collector electrode of said second transistor, the collector electrodes of said fourth and fifth transistors being connected in common to the other reference potential line;

a variable reference voltage source having a pair of terminals, one of the terminals being connected to the base electrodes of said third and sixth transistors, the other terminal being connected to said one reference potential line;

a fixed reference voltage source having a pair of terminals, one of the terminals being connected to the base electrodes of said fourth and fifth transistors, the other terminal being connected to said one reference potential line; and a current mirror circuit comprising seventh and eighth transistors, the emitter electrode of said seventh transistor being connected to the collector electrode of said third transistor and coupled to said other reference potential line, the emitter electrode of said eighth transistor being connected to the collector electrode of said sixth transistor and coupled to said other reference potential line, the base electrodes of said seventh and eighth transistors and the collector electrode of said eighth transistor being connected in common, the collector electrode of said seventh transistor being connected to said one reference potential line through a resistor and coupled to said output terminal, the collector electrode of said eighth transistor being connected to said one reference potential line through a third constant current source.

* * * * *